United States Patent
Furukawa et al.

(10) Patent No.: US 6,221,704 B1
(45) Date of Patent: Apr. 24, 2001

(54) PROCESS FOR FABRICATING SHORT CHANNEL FIELD EFFECT TRANSISTOR WITH A HIGHLY CONDUCTIVE GATE

(75) Inventors: Toshiharu Furukawa, Essex Junction; Mark C. Hakey; Steven J. Holmes, both of Milton; David V. Horak; James S. Nakos, both of Essex Junction; Paul A. Rabidoux, Winooski, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/089,650

(22) Filed: Jun. 3, 1998

(51) Int. Cl.[7] .......................... H01L 21/44; H01L 21/336
(52) U.S. Cl. .................... 438/197; 438/633; 438/299; 438/303; 438/585; 438/305; 438/595; 438/563
(58) Field of Search .................................. 438/633, 671, 438/672, 620, 592, 197, 299, 303, 585, 595, 563, 305

(56) References Cited

U.S. PATENT DOCUMENTS

| | | | |
|---|---|---|---|
| 4,980,317 | * 12/1990 | Koblinger et al. | 438/717 |
| 5,496,771 | * 3/1996 | Cronin et al. | 438/620 |
| 5,700,734 | * 12/1997 | Ooishi | 438/592 |

\* cited by examiner

Primary Examiner—Mary Wilczewski
Assistant Examiner—David Goodwin

(74) Attorney, Agent, or Firm—Pollock, Vande Sande & Amernick; Eugene I. Shkurko

(57) ABSTRACT

Semiconductor devices are fabricated by providing a substrate; forming isolation regions in the substrate; forming a first insulating layer on the isolation regions and the substrate; forming a conductive-forming layer on the first insulating layer; forming a second insulating layer on the conductive layer; forming a resist layer on the second insulating layer; forming an opening through the resist down to the second insulating layer located vertically between the isolation region; removing the second insulating layer beneath the opening down to the conductive-forming layer; depositing a conductive material through the opening over the conductive layer; planarizing the second insulating layer and the conductive material; removing the second insulating layer, the conductive-forming layer and the first insulating layer except beneath the conductive material; and forming source/drain regions in the substrate; or by providing a substrate; forming isolation regions in the substrate; forming a first insulating layer on the isolation regions and the substrate; forming a first conductive-forming layer on the first insulating layer; forming a second conductive layer on the first conductive-forming layer; forming a second insulating layer on the second conductive layer; forming a resist layer on the second insulating layer; forming an opening through the resist down to the second insulating layer located vertically between the isolation region; removing the second insulating layer beneath the opening down to the second conductive layer; depositing a third insulating material through the opening over the conductive layer; planarizing the second insulating layer and the third insulating material; removing the second insulating layer, the first conductive-forming layer and second conductive layer and the first insulating layer except beneath the third insulating material; and forming source/drain regions in the substrate.

33 Claims, 5 Drawing Sheets

PROCESS FOR FABRICATING SHORT CHANNEL FIELD EFFECT TRANSISTOR WITH A HIGHLY CONDUCTIVE GATE

DESCRIPTION

1. Technical Field

The present invention is concerned with a method for fabricating field effect transistors (FETs) with shorter channels along with highly conductive gate. In particular, according to the present invention, the gate is provided employing a self-aligned conductive lithographic mask. According to the present invention, an image reversal technique employing a conductive refractory material as a self-aligned etching mask for defining the gate is employed.

2. Background of Invention

The FET is an important electrical switching device in large scale integrated circuits. Such circuits may contains hundreds of million of FETs on a single semiconductor chip. Such chips typically measure less than 1 cm on a side. The physical size (i.e. the lateral dimensions) of the FET device and the ease of electrically interconnecting a plurality of FETs are important factors in determining how closely devices may be packed into a given chip area. Thus, the degree of integration is in part determined by the device packing density.

The demands for higher performance MOSFET require MOSFETs to have shorter channel lengths for higher current drive. However, as the device channel length becomes shorter, the gate wiring width narrows. The narrowing of the gate wiring width, in turn, makes it difficult to process the gate for achieving low resistance such as by salicidation. Accordingly, work continues for providing new lithographic procedures for yielding the minimally smallest structure for a given lithographic features size without significantly increasing the complexity of the fabricating process. For instance, a technique referred to as hybrid resist lithography has been employed for manufacturing high performance device structure. In particular, such technique makes it possible to print sub-lithographic images along with excellent ACLV (Across Chip Line-Width Variation) control. However, current hybrid resist lithography provides only sub-lithographic images of "space" but not the "line" delineation.

SUMMARY OF INVENTION

The present invention provides a process for fabricating high performance devices exhibiting shorter channel lengths along with achieving highly conductive gate structures. The present invention takes advantage of hybrid resist lithography for achieving sub-lithographic "line" definition. According to the present invention, such is made possible by employing an image reversal technique that employs a highly conductive and refractory material as a self-aligned etching mask for defining the gate structure.

More particularly, the method of the present invention comprises providing a substrate; and forming isolation regions in the substrate. Next, a first insulating layer is formed on the isolation regions and on the substrate, followed by a first conductive-forming layer being formed on the first insulating layer. On the first conductive-forming layer, a second insulating layer is formed. Next, a resist layer is formed on the second insulating layer. An opening is created through the resist layer down to the second insulating layer and located vertically between the isolation regions formed in the substrate. The portion of the second insulating layer exposed by the opening is removed down to the conductive-forming layer. A second conductive material is deposited through the opening over the first conductive layer. The second insulating layer and the deposited second conductive material are planarized. The second insulating layer, the first conductive layer and the first insulating layer except that beneath the second conductive material are removed. The source and drain regions are then formed in the substrate.

An alternative method according to the present invention comprises providing a substrate; and forming isolation regions in the substrate. Next, a first insulating layer is formed on the isolation regions and on the substrate, followed by a first conductive-forming layer being formed on the first insulating layer. A second and different conductive layer is formed on the first conductive-forming layer. On the second conductive layer, a second insulating layer is formed. Next, a resist layer is formed on the second insulating layer. An opening is created through the resist layer down to the second insulating layer and located vertically between the isolation regions formed in the substrate. The portion of the second insulating layer exposed by the opening is removed down to the second conductive layer.

A third insulating material different from the second insulating material is deposited through the opening over the second conductive layer. The second insulating layer and the deposited third insulating material are planarized. The second insulating layer, the first and second conductive layers and the first insulating layer except that beneath the third insulating material are removed. The source and drain regions are then formed in the substrate.

According to preferred aspects of the present invention, the resist layer is a hybrid resist layer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
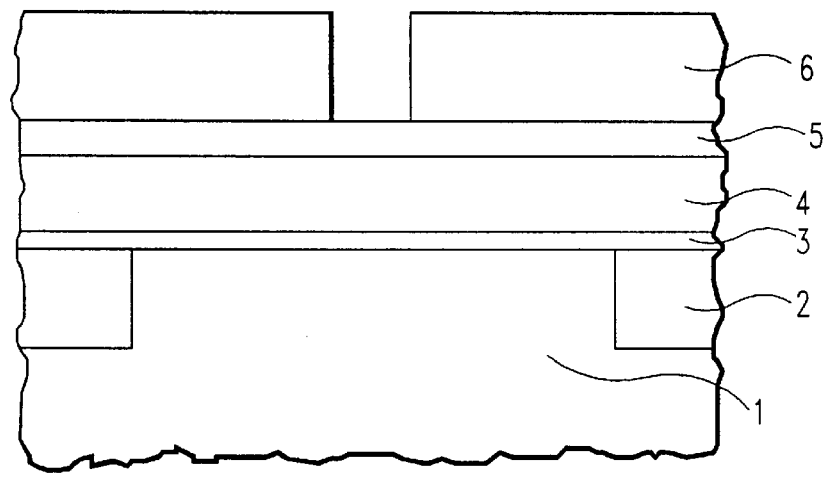
FIGS. 1–4 are schematic diagrams illustrating a device in different steps of the fabrication process of the present invention.

In order to facilitate an understanding of the present invention, reference will be made to the figures which illustrate a diagrammatic representation of the steps of the present invention.

According to the present invention, a semiconductor substrate 1 is provided. The semiconductor substrate 1 is typically silicon, for instance p-type single crystal silicon substrate, but can be any semiconductor material such as group II–VI semiconductors, group III–V semiconductors, a composite silicon semiconductors such as silicon carbide. Shallow trench isolation regions 2 are formed in the substrate 1. The isolation regions are typically silicon dioxide.

By way of example, a thin pad oxide such as about 5 nanometers to about 10 nanometers is thermally grown on p-type single crystal silicon substrate after the initial wafer cleaning. Pad nitride, about 5 nanometers to about 15 nanometers, is deposited over the pad oxide by chemical vapor deposition (CVD). Photoresist is applied over the wafer and shallow isolation trench (STI) regions are defined by a lithographic technique. Shallow trench 2, about 0.2 microns to about 0.5 microns deep, is then etched with the patterned photoresist as a mask. After stripping photoresist, thin oxide, about 2 nanometers to about 5 nanometers, is grown on the exposed silicon substrate in the STI (sidewalls and the bottom surface). The trench is then filled with CVD oxide and planarized to the top nitride surface by chemical-mechanical polishing (CMP). Next, the pad nitride and pad oxide are etched off and sacrificial oxide, about 3 nm to about 10 nm, is regrown on the exposed substrate surface.

Photoresist is applied over the wafer and n-well regions are defined by a lithographic technique. N-type dopant is implanted deep into the substrate to create n-well and the well surface area may be doped by other implantations to adjust PFET device parameters such as the device threshold voltage. After stripping the photoresist, new photoresist is applied and p-well regions are defined by a lithographic technique. P-type dopant is then implanted deep into the substrate to create p-well and the well surface area may be doped by other implantations to adjust NFET device parameters such as the device threshold voltage. After the implantations, the photoresist is stripped.

Next, sacrificial oxide is etched off and a first insulating layer 3 is formed over the substrate 1 including both in n-well and p-well regions (not shown) and over isolation regions 2. The first insulating layer 3 can be provided by thermal oxidation of silicon substrate or deposition techniques such as chemical vapor deposition (CVD) or physical vapor deposition (PVD). Typically, this layer is about 20 to about 100 Å thick, and more typically about 20 to about 60 Å thick, and acts as a gate insulator. Instead of thermal oxide, a gate insulator such as oxynitride may be deposited.

A conductive-forming layer 4 is provided on the first insulating layer 3. The conductive material 4 does not have to be conductive when it is deposited but it must be made conductive at the end of the process. For instance, different ways exist to make it conductive. For example, a conductive material such as doped polysilicon can be deposited. Alternatively, non-conductive material such as intrinsic polysilicon can be deposited and doping ions implanted into it before depositing subsequent image reversal insulating layer 5. Moreover, non-conductive material such as intrinsic polysilicon can be deposited and the gate polysilicon can be doped after the gate stack is defined. In a particular example, intrinsic polycrystalline silicon is deposited, and into the polysilicon, n-type dopant such as As or P is implanted over p-well area and p-type dopant such as B over n-well area with an appropriate blocking mask. The conductive-forming layer 4 is to provide the subsequently to be delineated gate conductor. Typically, the conductive-forming layer 4 is about 1000 to about 2000 Å thick. Next, a second insulating layer 5 is formed on conductive-forming layer 4 as an image reversal film. Typically, this second insulating layer is silicon oxide formed by CVD. Typically, this second insulating layer is about 200 to about 1000 Å thick. Other materials, such as silicon nitride and silicon oxynitride may be used as an image reversal film instead of or in addition to the silicon oxide.

Next, a photoresist layer 6 is formed on the second insulating layer 5. The photoresist can be applied by any convenient technique such as by spinning or spraying the photoresist composition. According to preferred aspects of the present invention, the photoresist employed is a hybrid resist layer.

Hybrid resists are disclosed in U.S. patent application Ser. No. 08/715,287 filed Sep. 16, 1996 to Hakey et al; Ser. No. 08/715,288 filed Sep. 16, 1996 to Hakey et al; and Ser. No. 08/959,779 filed Oct. 29, 1997, now U.S. Pat. No. 6,007,968, entitled "Method for Forming Features Using Frequency Doubling Hybrid Resist and Device Formed Thereby" to Furukawa et al, all of which are assigned to International Business Machines Corporation, the assignee of this application, and are all incorporated herein by reference.

A hybrid photoresist refers to a photoresist material having, simultaneously, both a positive tone and a negative tone response to exposure.

As a hybrid resist is exposed with actinic radiation, areas exposed with high intensity radiation form a negative tone line image. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during development. This resist response is an expression of the unique dissolution rate properties of a hybrid resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This "frequency doubling" capability of this resist allows conventional expose systems to be extended to higher pattern densities. For example, lines and spaces of 0.15 $\mu$m and less can be printed with current deep ultraviolet (DUV) lithography tools that are designed for operation at 0.30 $\mu$m resolution.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The photoresist resins suitable for use in a hybrid resist include any of the base-soluble, long chain polymers suitable for use as a polymer resin in a photoresist formulation. Specific examples include: (i) aromatic polymers having a —OH group, e.g. polyhydroxystyrenes such as poly(4-hydroxystyrene), poly(3-hydroxystyrene), commercially available from Hoechst Celanese of Corpus Christi, Tex., novolak resins commercially available from Shipley of Marlboro, Mass., and polymers having a phenolic —OH group, e.g. phenol formaldehyde resins; (ii) polymers having an acid group, e.g. polymethacrylic acid with an ester side chain; and (iii) acrylamide group type polymers.

Crosslinking compositions are typically tetramethoxymethyl glycouril ("Powderlink") and 2,6-bis(hydroxymethyl)-p-cresol. However, other possible crosslinking compositions include:

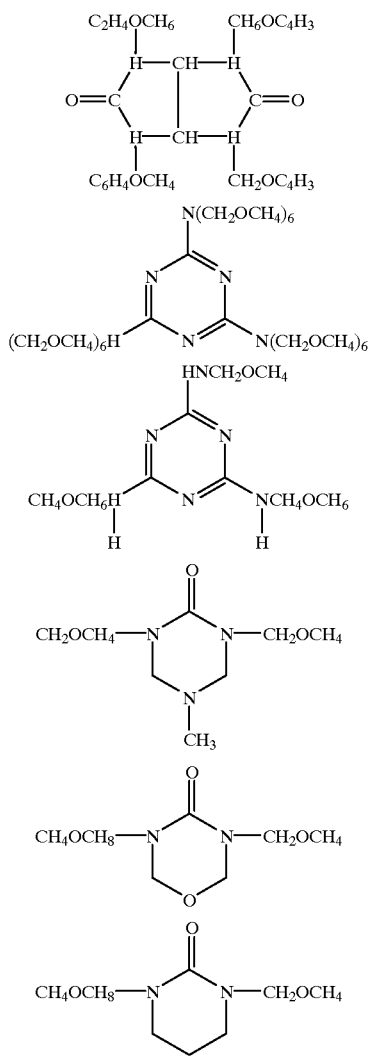

their analogs and derivatives, as can be found in Japanese Laid-Open Patent Application (Kokai) 1-293339, as well as etherified amino resins, for example methylated or butylated melamine resins (N-methoxymethyl- or N-butoxymethyl-melamine respectively) or methylated/butylated glycolurils, for example of the formula:

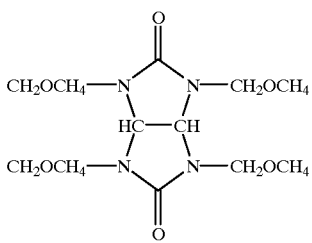

as can be found in Canadian Patent No. 1,204,547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliaodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxynaphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. Typically, the sensitizers will be nitrogen free, because the presence of nitrogen, e.g. an amine of phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

The resist is exposed to actinic light such as UV or x-ray radiation or electron beam using a predetermined lithographic mask pattern, and in the case of a negative resist, the unexposed regions of the resist are developed by dissolution in a solvent, and in the case of a positive tone resist, the exposed portions of the resist are developed by dissolution in a solvent. Development of the photoresist forms an opening down to the second insulating layer 5 and located vertically between isolation regions 2.

Figure 2:
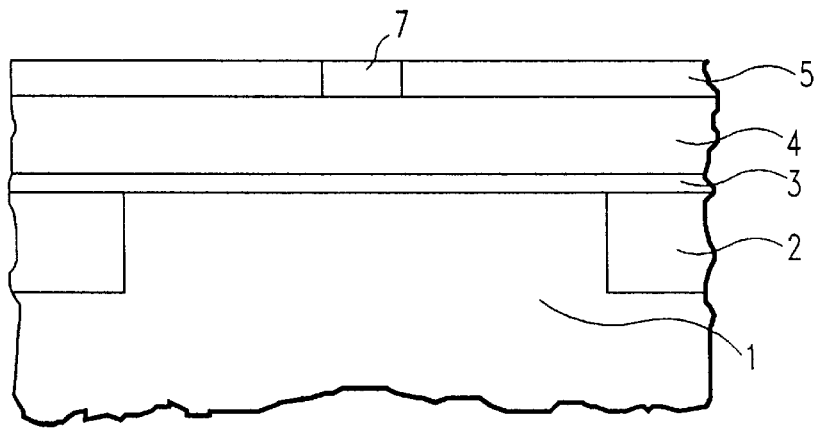

Those portions of the second insulating layer 5 located beneath the opening in the photoresist layer 6 is removed down to conductive forming layer 4. The insulating layer 5 can be etched by reactive ion etching. The underlying conductive forming layer 4 acts as an etch stop. The trench created in insulating layer 5 is filled with a conductive material, after stripping the photoresist. See FIG. 2. Examples of suitable conductive material 7 include tungsten, tungsten silicide, titanium silicide, cobalt silicide and titanium nitride. The tungsten or tungsten silicide can be formed by CVD such as by $SiH_4$ or $H_2$ reduction of $WF_6$.

The conductive material 7 and second insulating layer 5 can be planarized such as employing chemical-mechanical polishing (CMP). Also, in the case of a hybrid resist, which creates lithographic features in the form of a loop, trimming of the conductive material is carried out such as by etching with a trim mask or by other known trimming techniques. Trimming obtained by employing a second masking step involves segmenting the looped features.

The now exposed second insulating layer 5 is removed such as by reactive ion etching or wet etching followed by directional reactive ion etching of conductive forming layer 4 using the conductive material 7 as a mask to prevent removal of material protected by the conductive material 7 to define the gate. The conductive material 7 used as the etching mask is kept as a part of the gate stack to provide a high conductive gate. The first insulating layer 3 is removed by reactive ion etching using the conductive material 7 and conductive-forming layer 4 as a mask. The remaining portion of the first insulating layer 3 beneath the conductive-forming material 4 and conductive material 7 acts as the gate oxide insulation.

Next, shallow source and drain extension diffusions 8 are provided within oxide or nitride spacers 9 along the vertical walls of the gate. See FIG. 3. P-type dopant source material such as boron doped glass (BSG) and thin diffusion preventing material such as nitride are deposited and patterned so that BSG contacts only S/D region and polysilicon gate over the n-well area. Next, n-type dopant source material such as arsenic doped glass (ASG) is deposited. The wafer is then heated to drive the dopant from the dopant source to reactively narrow poly Si gate and S/D extension region. If desired, source/drain deep diffusions 10 can be provided such as by ion implantation with oxide or nitride spacer 9.

Figure 3:
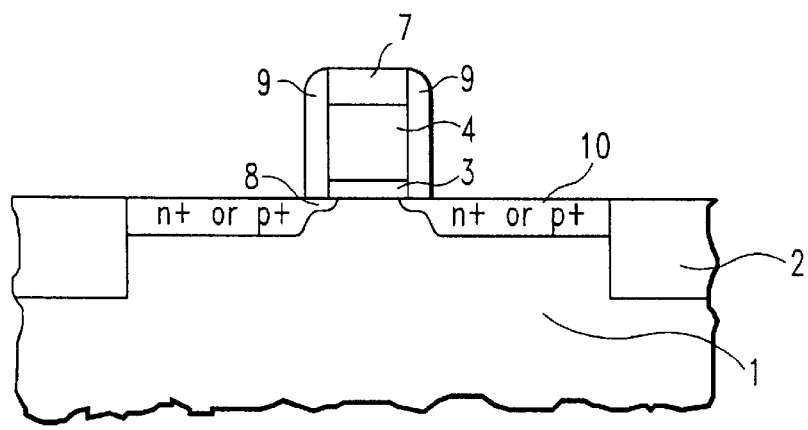

For example, after the narrow gate poly Si and the S/D extensions are doped, spacer forming material such as oxide or nitride can be deposited and directionally etched to form the gate spacer. The solid doping source material may be used to form the spacer. N+ or P+ implantation is then made with a blocking mask covering the opposite type doping area to form the deep S/D diffusion and to dope reactively wide poly Si lines. Dopants are activated by a rapid thermal anneal. The spacers are used to keep the deep S/D diffusion away from the device gate edge in order to minimize the short channel effects. The deep S/D diffusion is needed to form diffusion contact without causing severe junction leakage. The resulting structure is shown in FIG. 3. The device area is then covered with insulating material. The contacts to diffusions 10 and gate 4 are made and they are wired by metal lines to form electrical circuits.

Furthermore, for extremely narrow gate dimensions such as less than about 0.2 micron, it may be desirable to dope the conductive gate material such as the polysilicon before etching of the gate material or doping it from the polysilicon gate sidewall to ensure sufficient doping in the polysilicon gate.

According to preferred aspects of the present invention, the channel is less than 0.15 microns in length.

Figure 4:
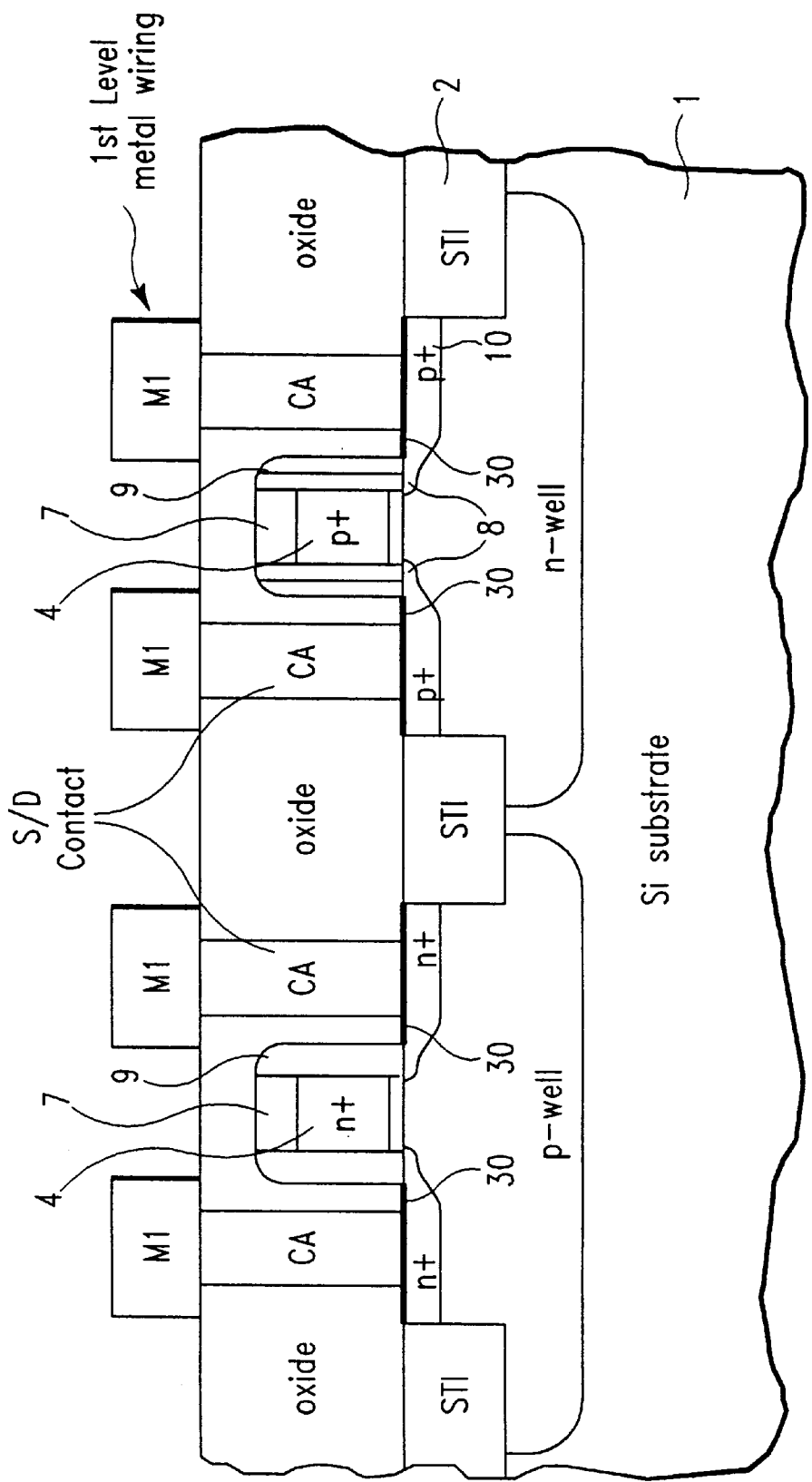
Figure 5:
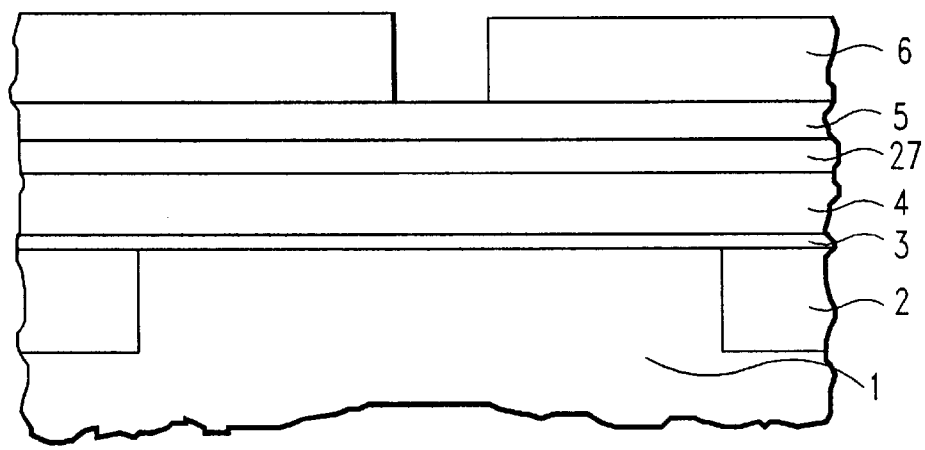
FIGS. 5–8 are schematic diagrams illustrating an alternative structure in different steps of the fabrication process of the present invention.
Figure 6:
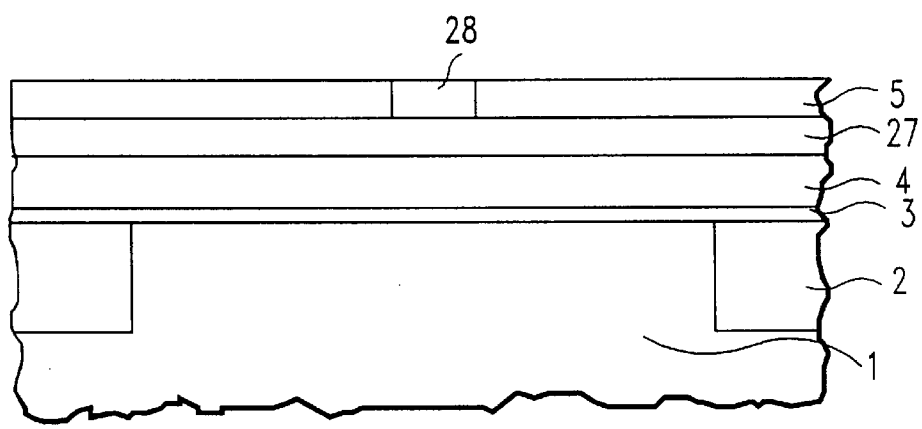
Figure 7:
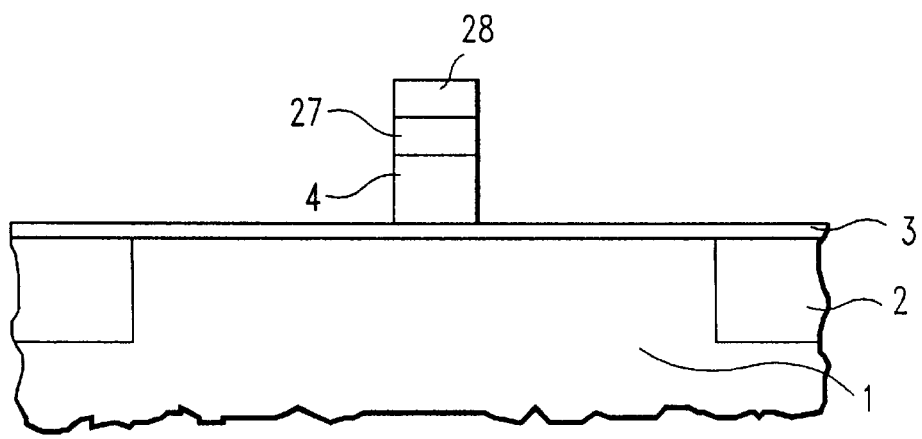

After deep S/D diffusion formation, silicide 30, such as $TiSi_x$ or $CoSi_x$ is selectively formed (salicide) over the diffusion, insulation material is deposited to fill the gap between the gate stacks and covering over the gate stack and may be planarized by CMP. Contact holes (CA) are then etched through the insulation material to S/D diffusions and poly Si wiring. The contact holes are filled by high conductive material such as W or $Wsi_x$ and planarized to form a contact plug. First level metal (M1) line is then formed over the contact plug to wire the FET device into a desired circuit, as shown in FIG. 4.

Reference to FIGS. 5–8 illustrate an alternative embodiment according to the present invention. In this embodiment, the sequence as discussed above for the embodiment illustrated in FIGS. 1–4 is followed through and including the step of depositing a conductive-forming layer 4. At this stage in the process, a second conductive layer 27 is formed on the first conductive-forming layer 4. See FIG. 5. This layer is typically about 50 to about 1000 Å thick. Examples of suitable conductive materials 27 include tungsten, tungsten silicide, titanium silicide, cobalt silicide and titanium nitride. The tungsten or tungsten silicide can be formed by CVD such as by $SiH_4$ or $H_2$ reduction of $WF_6$.

Next, a second insulating layer 5 is formed on conductive-forming layer 4. Typically, this second insulating layer is silicon oxide formed by CVD. Typically, this second insulating layer is about 200 to about 1000 Å thick.

Next a photoresist layer 6 is formed on the second insulating layer 5. The photoresist can be applied by any convenient technique such as by spinning or spraying the photoresist composition. According to preferred aspects of the present invention, the photoresist employed is a hybrid resist layer, as discussed above.

The resist is exposed to actinic light such as UV radiation using a predetermined lithographic mask pattern. Development of the photoresist forms an opening down to the second insulating layer 5 and located vertically between isolation regions 2.

Those portions of the second insulating layer 5 located beneath the opening in the photoresist layer 6 is removed down to the second conductive layer 27. The insulating layer 5 can be etched by reactive ion etching. The underlying conductive layer 27 acts as an etch stop. The trench created in insulating layer 5 is filled after stripping the photoresist with a third insulating material 28 that differs from the insulating layer 5. See FIG. 6. An example of a suitable insulating material 28 is silicon nitride formed by chemical vapor deposition.

The insulating material 28 and second insulating layer 5 can be planarized such as employing chemical-mechanical polishing (CMP). Also, in the case of a hybrid resist, trimming of the insulating material 28 is carried out such as by etching with a trim mask.

The now exposed second insulating layer 5 is removed such as by reactive ion etching or wet etching followed by directional reactive ion etching of conductive layers 27 and 4 using the third insulating material 28 as a mask to prevent removal of material protected by the third insulating material 28. The first insulating layer 3 is removed by reactive ion etching using the insulating material 28 and conductive layers 27 and 4 as a mask. The remaining portion of the first insulating layer 3 beneath the conductive material 4 and conductive material 27 acts as the gate oxide insulation.

The insulating material 28 used as the etching mask can be retained as part of the gate stack to provide a self-aligned gate diffusion contact borderless to gate. See FIG. 7.

Next, shallow source and drain extension diffusions 8 are provided within oxide or nitride spacer 9 along the vertical walls of the gate. See FIG. 8.

P-type dopant source material such as boron doped glass (BSG) and thin diffusion preventing material such as nitride are deposited and patterned so that BSG contacts only S/D region and polysilicon gate over the n-well area. Next, n-type dopant source material such as arsenic doped glass (ASG) is deposited. The wafer is then heated to drive the dopant from the dopant source to poly Si gate and S/D extension region. If desired, source/drain deep diffusions 10 can be provided such as by ion implantation with oxide or nitride spacer 9.

For example, after the narrow gate poly Si and the S/D extensions are doped, spacer forming material such as oxide or nitride can be deposited and directionally etched to form the gate spacer. The solid doping source material may be used to form the spacer. N+ or P+ implantation is then made with a blocking mask covering the opposite type doping area to form the deep S/D diffusion and to dope wider poly Si lines. Dopants are activated by a rapid thermal anneal. The spacers are used to keep the deep S/D diffusion away from the device gate edge in order to minimize the short channel effects. The deep S/D diffusion is needed to form diffusion contact without causing severe junction leakage. The device area is then covered with insulating material. The contacts to diffusions 10 and gate 4 are made and they are wired by metal lines to form electrical circuits. The resulting structure is shown in FIG. 8.

Figure 8:
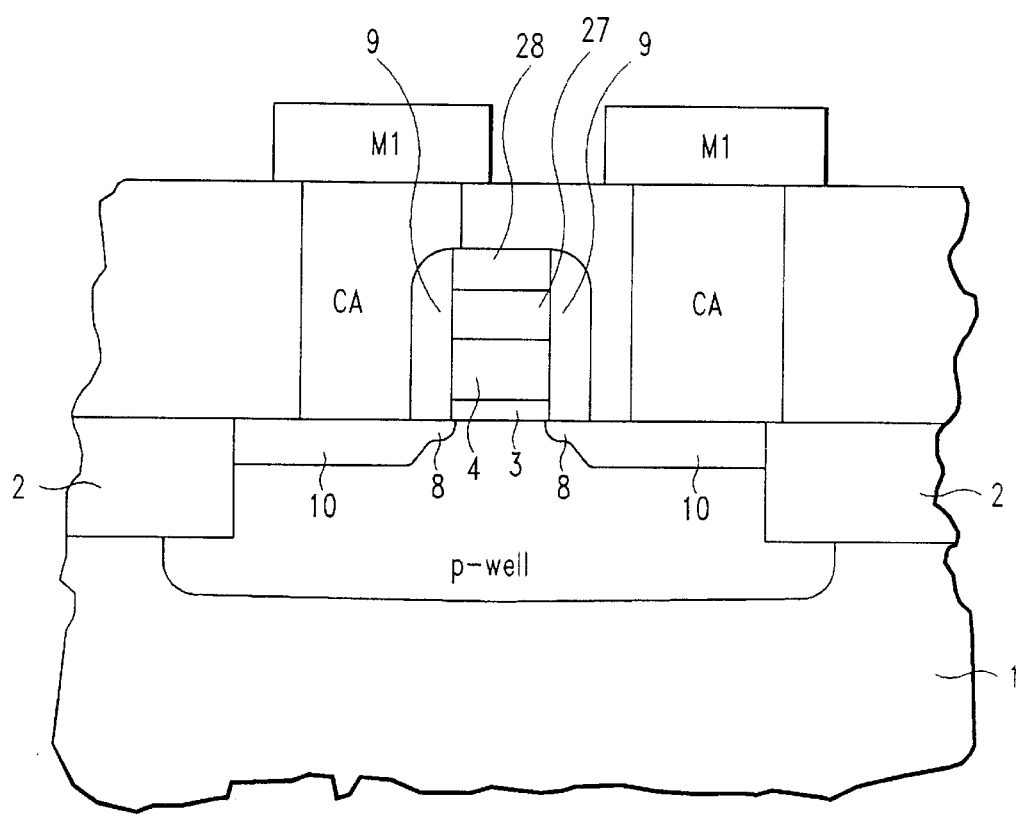
Figure 9:
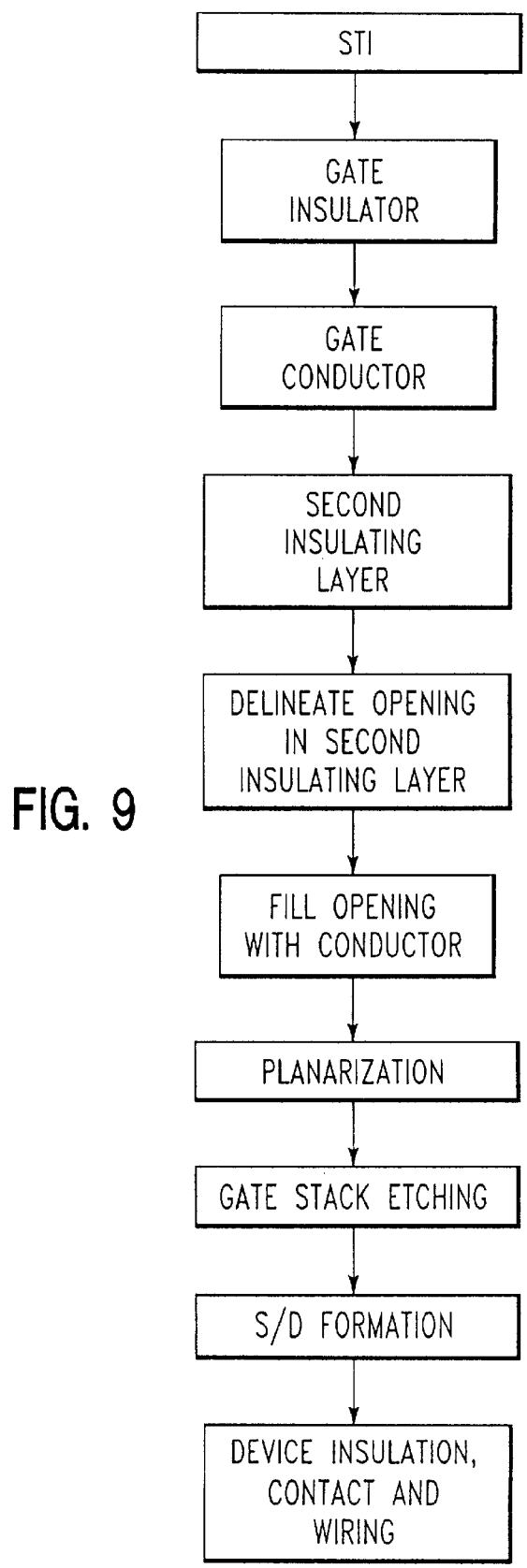
FIG. 9 is a flow diagram of the sequence of fabrication steps employed according to the present invention.

FIG. 8 illustrates an advantage of retaining insulating material 28 as part of the gate studs to provide self-aligned gate diffusion contact. For example, CA (S/D contacts) are illustrated as being misaligned to the right to show that CA is "borderless" to gate. However, CA does not short to gate even when CA is misaligned and dropped over the gate. In particular, the insulating material 28 and spacers 9 prevent the CA etch from etching into the gate stack. M1 represents metal lines.

Furthermore, for extremely narrow gate dimensions such as less than about 0.2 micron, it may be desirable to dope the conductive gate material such as the polysilicon before etching of the gate material or doping it from the polysilicon gate sidewall to ensure sufficient doping in the polysilicon gate.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating a semiconductor device which comprises:

providing a semiconductor substrate;

forming isolation regions in said substrate;

forming a first insulating layer on said isolation regions and on said substrate;

forming a conductive-forming layer on said first insulating layer;

forming a second image reversal insulating layer on said conductive-forming layer;

forming a resist layer on said second insulating layer;

forming an opening through said resist layer down to the second insulating layer whereby said opening is located vertically between said isolation regions;

removing those portions of said second insulating layer located beneath said opening down to said conductive forming layer;

depositing a conductive material through said opening over said conductive forming layer and over said second insulating layer;

planarizing said second insulating layer and said conductive material;

removing said second insulating layer;

removing said conductive-forming layer and said first insulating layer except for those portions located beneath said conductive material whereby said conductive material acts as a mask thereby defining a gate; and forming source/drain regions in said substrate.

2. The method of claim 1 wherein said step of forming the resist layer includes forming a hybrid resist layer on said second insulating layer.

3. The method of claim 1 wherein said conductive-forming layer is doped polycrystalline silicon.

4. The method of claim 1 wherein said conductive material is tungsten or tungsten silicide.

5. The method of claim 1 wherein said forming said isolation regions comprises forming shallow trench isolation regions.

6. The method of claim 1 wherein forming said first insulating layer comprises thermally grown silicon dioxide in the silicon substrate.

7. The method of claim 6 wherein the thickness of the thermally grown silicon dioxide is about 30 to about 100 Å.

8. The method of claim 1 wherein forming said second insulating layer comprises chemical vapor depositing silicon dioxide.

9. The method of claim 8 wherein the thickness of the deposited silicon dioxide is about 200 to about 1000 Å thick.

10. The method of claim 1 wherein forming said opening comprises reactive ion etching.

11. The method of claim 1 which further includes providing gate spacer on the lateral walls of said gate.

12. The method of claim 11 wherein said gate spacers are silicon dioxide or silicon nitride.

13. The method of claim 3 which further includes doping said polysilicon prior to removing portions of it.

14. The method of claim 1 wherein said conductive material is selected from the group consisting of tungsten, tungsten silicide, titanium silicide, cobalt silicide and titanium nitride.

15. A method for fabricating a semiconductor device which comprises:

providing a semiconductor substrate;

forming isolation regions in said substrate;

forming a first insulating layer on said isolation regions and on said substrate;

forming a first conductive-forming layer on said first insulating layer;

forming a second and different conductive layer on said first conductive forming layer;

forming a second image reversal insulating layer on said second conductive forming layer;

forming a resist layer on said second insulating layer;

forming an opening through said resist layer down to the second insulating layer whereby said opening is located vertically between said isolation regions;

removing those portions of said second insulating layer located beneath said opening down to said second conductive layer;

depositing a third insulating material through said opening over said second conductive layer and over said second insulating layer;

planarizing said second insulating layer and said third insulating material;

removing said second insulating layer;

removing said first conductive-forming layer and second conductive layer and said first insulating layer except for those portions located beneath said third insulating material whereby said third insulating material acts as a mask thereby defining a gate; and forming source/drain regions in said substrate.

16. The method of claim 15 wherein said step of forming the resist layer includes forming a hybrid resist layer on said second insulating layer.

17. The method of claim 15 wherein said first conductive-forming layer is doped polycrystalline silicon.

18. The method of claim 15 wherein said second conductive layer is tungsten or tungsten silicide.

19. The method of claim 15 wherein said forming said isolation regions comprises forming shallow trench isolation regions.

20. The method of claim 15 wherein forming said first insulating layer comprises thermally grown silicon dioxide in the silicon substrate.

21. The method of claim 20 wherein the thickness of the thermally grown silicon dioxide is about 30 to about 100 Å.

22. The method of claim 15 wherein forming said second insulating layer comprises chemical vapor depositing silicon dioxide.

23. The method of claim 22 wherein the thickness of the deposited silicon dioxide is about 200 to about 1000 Å thick.

24. The method of claim 15 wherein forming said opening comprises reactive ion etching.

25. The method of claim 15 which further includes providing gate spacer on the lateral walls of said gate.

26. The method of claim 25 wherein said gate spacers are silicon dioxide or silicon nitride.

27. The method of claim 17 which further includes doping said polysilicon prior to removing portions of it.

28. The method of claim 15 wherein said second conductive layer is selected from the group consisting of tungsten, tungsten silicide, titanium silicide, cobalt silicide and titanium nitride.

29. The method of claim 15 wherein said third insulating material is silicon nitride.

30. The method of claim 1 whereby the gate has dimensions of less than about 0.2 microns.

31. The method of claim 1 being a channel beneath the gate of less than 0.15 microns in length.

32. The method of claim 15 whereby the gate has dimensions of less than about 0.2 microns.

33. The method of claim 15 being a channel beneath the gate of less than 0.15 microns in length.

* * * * *